(12) United States Patent
Bringivijayaraghavan et al.

(10) Patent No.: US 9,208,859 B1
(45) Date of Patent: Dec. 8, 2015

(54) LOW POWER STATIC RANDOM ACCESS MEMORY (SRAM) READ DATA PATH

(71) Applicant: INTERNATIONAL BUSINESS MACHINES CORPORATION, Armonk, NY (US)

(72) Inventors: Venkatraghavan Bringivijayaraghavan, Tamilnadu (IN); Dhani Reddy Sreenivasula Reddy, Proddatur (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/466,385

(22) Filed: Aug. 22, 2014

(51) Int. Cl.
*G11C 7/10* (2006.01)
*G11C 11/419* (2006.01)

(52) U.S. Cl.
CPC .................................... *G11C 11/419* (2013.01)

(58) Field of Classification Search
USPC ............................ 365/189.02, 230.02, 230.06
See application file for complete search history.

(56) References Cited

U.S. PATENT DOCUMENTS

| 5,502,676 | A | 3/1996 | Pelley, III et al. |
| 5,673,227 | A | 9/1997 | Engles et al. |
| 6,256,262 | B1 | 7/2001 | Chen et al. |
| 6,865,102 | B1 | 3/2005 | Hirabayashi |
| 7,525,867 | B2 | 4/2009 | Ramaraju et al. |
| 8,064,269 | B2 | 11/2011 | Brown et al. |
| 8,189,395 | B2 | 5/2012 | Shiga et al. |
| 8,335,120 | B2 * | 12/2012 | Shinohara ................ G11C 7/12 365/154 |
| 8,547,750 | B2 | 10/2013 | Yip |
| 2010/0260002 | A1 * | 10/2010 | Chen .................... G11C 11/413 365/207 |
| 2012/0057414 | A1 | 3/2012 | Park et al. |
| 2013/0272064 | A1 | 10/2013 | Aritome |

FOREIGN PATENT DOCUMENTS

| CN | 1423278 | 5/2012 |
| JP | 03002941 | 1/1991 |
| JP | 07220474 | 8/1995 |
| JP | 2008287882 | 11/2008 |
| JP | 2010192049 | 9/2010 |

\* cited by examiner

*Primary Examiner* — Vu Le
(74) *Attorney, Agent, or Firm* — Anthony Canale; Andrew M. Calderon; Roberts Mlotkowski Safran & Cole, P.C.

(57) ABSTRACT

A memory circuit configured for reducing dynamic read power is disclosed that includes a first read global bit line connected to a first sense amp and a second read global bit line connected to a second sense amp. The second read global bit line is adjacent to the first read global bit line. The memory circuit further includes a third read global bit line and logic circuitry connected to the first read global bit line, the second read global bit line, and the third read global bit line. The logic circuitry is configured to determine when both the first read global bit line and the second read global bit line are evaluated as in a high state, and in response to the determining, toggle the third read global bit line to the high state.

20 Claims, 11 Drawing Sheets

LOW POWER STATIC RANDOM ACCESS MEMORY (SRAM) READ DATA PATH

FIELD OF THE INVENTION

The invention relates to memory devices and, more particularly, to structures and methodologies for reducing dynamic read power in static random access memory (SRAM).

BACKGROUND

Memory devices are commonly employed as internal storage areas in a computer or other type of electronic equipment. One specific type of memory used to store data in a computer is random access memory (RAM), such as static RAM (SRAM) or dynamic RAM (DRAM), for example. A typical SRAM device includes an array of individual SRAM cells. Each SRAM cell is capable of storing a binary voltage value that represents a logical data bit (e.g., "0" or "1"). One existing configuration for an SRAM cell includes a pair of cross-coupled devices such as inverters. With complementary metal oxide semiconductor (CMOS) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array. In a conventional six-transistor (6T) cell, a pair of access transistors or pass gates (when activated by a word line) selectively couples the inverters to a pair of complementary bit lines. Other SRAM cell designs may include a different number of transistors, e.g., 4T, 8T, etc.

Static power and dynamic power constitute the two main components of total power used by memory devices such as SRAM. Static power essentially consists of the power used when a transistor is not in the process of switching and may be determined by the formula: P=Istatic(Vdd). Where Vdd is the supply voltage and Istatic is the total current flowing through the memory device. Dynamic power essentially consists of transient power consumption and capacitive load power consumption. Transient power consumption represents the amount of power consumed when the memory device changes logic states, e.g., "0" bit to "1" bit or vice versa. Capacitive load power consumption represents the power used to charge the load capacitance. Dynamic power may be determined by the formula: $P=C(Vdd)^2 f$. Where C is the capacitance, Vdd is the supply voltage, and f is the frequency.

Due to rapid advancement in very large scale integration technology over the last couple decades, aggressive scaling of CMOS transistor dimensions is becoming a trend in order to achieve high package density chips and improved performance. Supply voltage and threshold voltage are also scaled in order to maintain the reliable operation of the transistors. Dynamic power in SRAM is becoming a big concern with scaling because with the scaling in supply voltage, metal width, and spacing, the power consumption of the SRAM is assumed to scale down by 50%. However, the power consumption of the SRAM is not scaling as much as assumed with the scaling of supply voltage, metal width, and spacing in very large scale integration technology.

In SRAM devices, the major part of dynamic power consumption comes from read power because read activity can be as high as about 90% on a memory device. Specifically, read global bit line switching or toggling power (i.e., transient power consumption) is one of the major contributors to the total read power. Reducing metal width, increasing metal spacing, and reducing supply voltage are some common practices that are followed for reducing the power consumption. However, reducing the metal width increases resistance, which diminishes performance, increasing metal spacing increases the metal pitch, which affects the area of the device, and the performance of the SRAM cell is significantly affected at low supply voltages. Accordingly, new methods to reduce power consumption of SRAM devices are needed over merely reducing metal width, increasing metal spacing, and reducing supply voltage.

SUMMARY

In a first aspect of the invention, a memory circuit configured for reducing dynamic read power is provided for that includes a first read global bit line connected to a first sense amp and a second read global bit line connected to a second sense amp. The second read global bit line is adjacent to the first read global bit line. The memory circuit further includes a third read global bit line and logic circuitry connected to the first read global bit line, the second read global bit line, and the third read global bit line. The logic circuitry is configured to determine when both the first read global bit line and the second read global bit line are evaluated as in a high state, and in response to determining both the first read global bit line and the second read global bit line are evaluated as in the high state, toggle the third read global bit line to the high state.

In another aspect of the invention, a memory circuit is provided for that includes a pair of read global bit lines connected to a pair of sense amps respectively and a multiplexer. The pair of read global bit lines is configured to read a logic state of two memory cells respectively located within two adjacent columns of memory cells. The memory circuit further includes an additional read global bit line and logic circuitry connected to the pair of read global bit lines and the additional read global bit line. The logic circuitry is configured to determine when both read global bit lines of the pair of read global bit lines are evaluated as a high state, and in response to determining both of the read global bit lines are evaluated as in the high state, toggle only the additional read global bit line to the high state.

In a further aspect of the invention, a method is provided for that includes precharging a first read global bit line, a second read global bit line, and a third read global bit line to a low state prior to a read operation of a SRAM device. The method further includes when a first data line is in a low state, evaluate the first read global bit line as in a high state. The method further includes when a second data line is in the low state, evaluate the second read global bit line as in the high state. The method further includes when both the first read global bit line and the second read global bit line are evaluated as in the high state, toggle the third read global bit line to the high state rather than toggling both of the first read global bit line and the second read global bit line to the high state.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to memory devices and, more particularly, to structures and methodologies for reducing dynamic read power in static random access memory (SRAM). More specifically, implementations of the invention provide an SRAM device and memory read methodology such that upon detecting the two read global bit lines (e.g., adjacent read global bit lines) are evaluated to be logic high, a new signal and bit line is toggled and both of the read global bit lines are evaluated as one line. In this manner, it is no longer necessary to toggle both read global bit lines as was performed conventionally, which advantageously results in a 50% power savings for the SRAM device during such a read pattern where adjacent read global bit lines are supposed to be evaluated as logic high.

Figure 1:
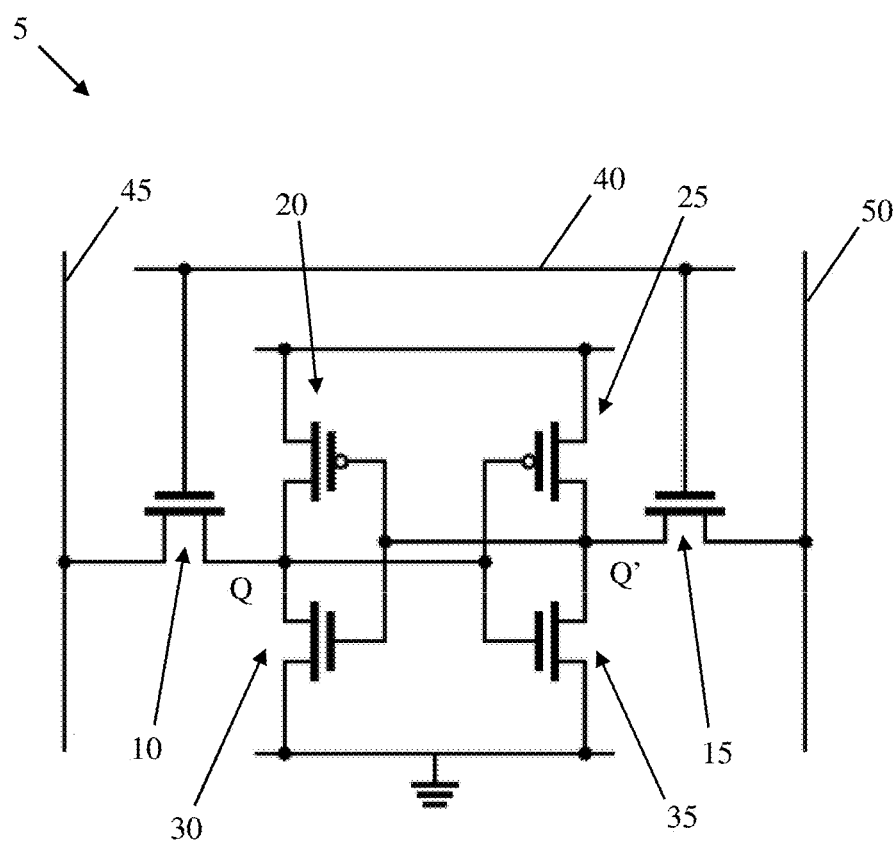
FIG. 1 shows a schematic diagram of a 6T SRAM cell in accordance with aspects of the invention.

FIG. 1 illustrates a conventional SRAM structure. The SRAM structure of FIG. 1 is a typical 6T (6 transistor) SRAM cell 5 comprising field effect transistors (FETs) 10, 15, 20, 25, 30, and 35. The SRAM cell 5 is a memory cell capable of storing one bit of data (e.g., a logic 1 or a logic 0). Each bit in the SRAM structure is stored on the four transistors 20, 25, 30, and 35 that form two cross-coupled inverters. The two additional access transistors 10 and 15 serve to control the access to the storage cell during read and write operations.

Access to the cell is enabled by the word line 40 which controls the two access transistors 10 and 15 which, in turn, control whether the cell should be connected to the bit lines 45 and 50. The bit lines 45 and 50 are used to transfer data for both read and write operations. The bit line 45 is a data line on which data to be read from or written to the SRAM cell 5 is placed, and the bit line 50 is the complement (opposite voltage value) of the bit line 45 (e.g., complement bit line). Typically, the bit lines 45 and 50 are held to a high voltage level (e.g., a logic 1), unless it is actively selected for either writing into or reading from a cell. For instance, when writing data to the SRAM cell 5, the bit line 45 is actively driven low by an outside source (e.g., an instruction being executed by the processor) if the outside source desires to write a logic 0 to the SRAM cell 5. Otherwise, if an outside source desires to write logic 1 to the SRAM cell 5, the bit line 45 remains high, where as bit line 50 is actively driven low by an outside source. Thereafter, the word line 40 is fired (e.g., caused to go to a high voltage level), at which time the value of the bit line 45 is written into the SRAM cell 5.

When reading data from the SRAM cell 5, the word line 40 is fired, and the bit lines 45 and 50 are driven by the SRAM cell 5 based on the data stored. That is, the bit line 45 is pulled low and bit line 50 remains high by the SRAM cell 5 if the data stored therein is logic 0, and the bit line 45 remains high and bit line 50 is driven low if the value stored in the SRAM cell 5 is logic 1. More specifically, when reading data from the SRAM cell 5, the bit line 45 is pulled to a low voltage value by N-channel FET (NFET) 10 if the data stored in the SRAM cell 5 is logic 0. However, if the value stored in the SRAM cell 5 is logic 1, the bit line 50 is pulled to low voltage value by N-channel FET (NFET) 15.

In a read operation such as discussed above, the access time of detecting the logic state stored in the SRAM cell 5 is a key performance index for a memory circuit. Delay in the read operation may result from bit line sensing due to a large capacitance resulting from a large number of memory cells (e.g., a large number of SRAM cells 5) in an array coupled to a same set of bit lines. In order to reduce the delay associated with bit line sensing, conventional memory circuits may partition the bit lines into two groups, namely local bit lines (e.g., the bit lines 45 and 50) and global bit lines (not shown). As a result, the local bit lines may perform a fast read operation because the capacitance of the local bit lines is reduced in comparison to that of the bit lines in a memory circuit without bit line partitioning.

Figure 2:
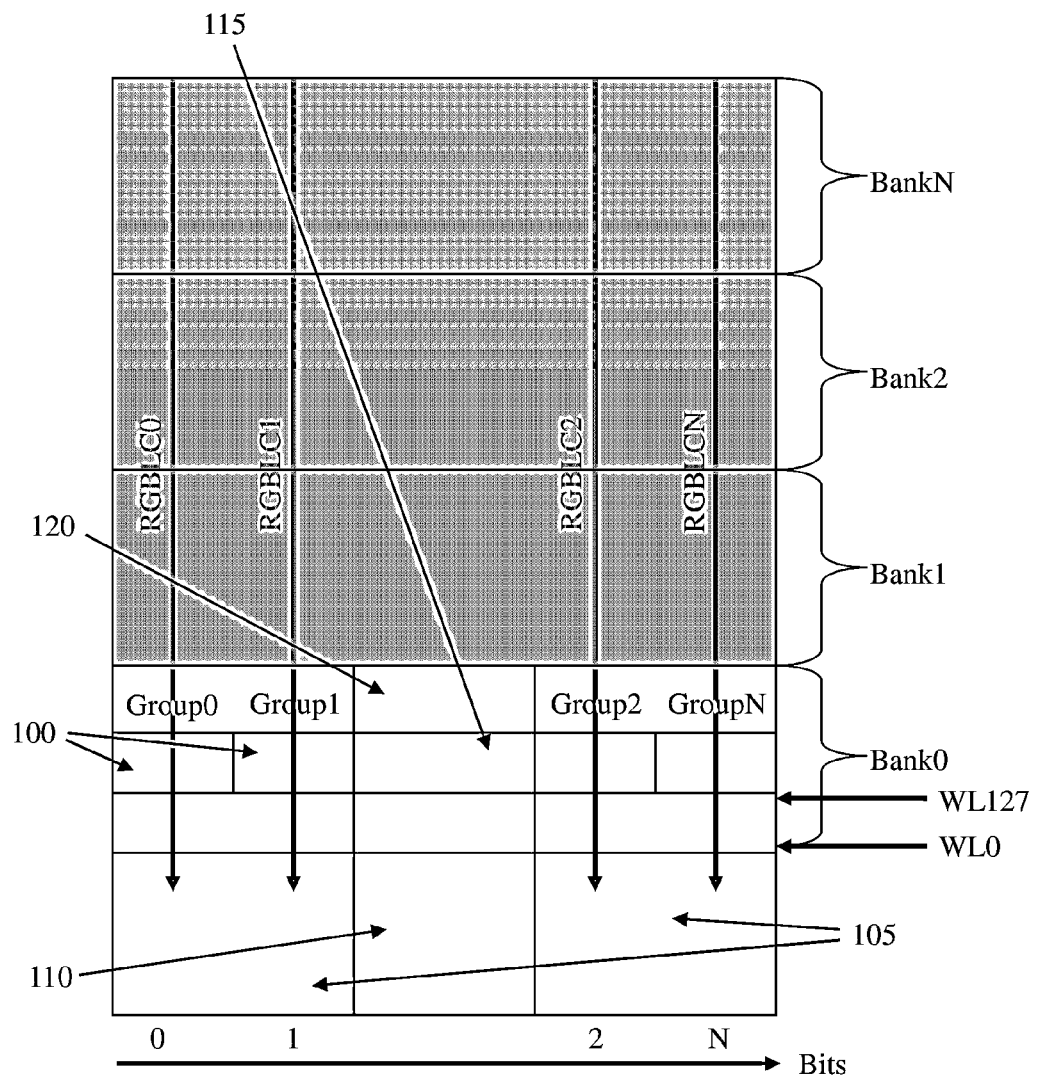
FIGS. 2-5 show SRAM circuit designs in accordance with aspects of the invention.

As shown in FIG. 2, a memory circuit may comprise N memory banks, namely Bank0, Bank1, Bank2 . . . , BankN. Each memory bank (e.g., Bank0) may comprise N pairs of local bit lines. For example, a first pair of bit lines may be coupled to a first memory group (e.g., Group0), which may comprise a plurality of memory cells connected in parallel. On the other hand, a second pair of bit lines may be coupled to a second memory group (e.g., Group1), which may comprise a plurality of memory cells connected in parallel. The first pair of bit lines and the second pair of bit lines may be coupled to a bit slice processor 100 comprising a column decoder configured to decode column address bits applied to a column address line in order to select a column of cells to be accessed from among the columns in the memory banks, sense amplifiers connected to the cells that are configured to sense and amplify bit values accessed in the cells in accordance with the outputs of the row decoder and the column decoder, a write driver configured to perform a write operation to the cells during a write operation, and a row decoder 120 configured to decode row address bits applied to a row address line in order to select a row of cells to be accesses from among the rows in the memory banks.

For a memory bank having N pairs of local bit lines, N/m sense amplifiers may be employed if column multiplexing=m, to receive the data from the memory bank. More particularly, each sense amplifier may receive two input signals from the 'm' set of bit lines based on column multiplexing. Furthermore, the sense amplifiers (also referred to herein as a transmitter) may be configured to perform a logic operation (e.g., a NAND operation) and generate an output coupled to a corresponding input of an input/output I/O multiplexer 105 (also referred to herein as a receiver). For example, the output of the logic operation may be used to toggle or switch a global bit line (e.g., read global bit line associated with each group RGBLC0, RGBLC1, RGBLC2, and RGBLC3) associated with each memory group. More specifically, the data read from the memory group Group0, Group1, Group2, GroupN may be forwarded to the read global bit line RGBLC0, RGBLC1, RGBLC2, and RGBLCN, respectively, via each associated sense amplifier, and the read global bit line RGBLC0, RGBLC1, RGBLC2, and RGBLCN may be coupled to a corresponding input of the I/O multiplexer 105. The I/O multiplexer 105 forwards the selected input received from the read global bit line RGBLC0, RGBLC1, RGBLC2, and RGBLCN to a buffer (not shown) for accumulating and reading data from any number of memory cells. The buffer may employ a bus keeper (not shown) so that reliable data out can be read at the output of the buffer.

In the memory circuit, each memory cell can be accessed in one or more types of read and write cycles, as specified by control signals supplied to a global control unit 110. In response to control signals, the global control unit 110 controls the operation of a data control circuit or sub control 115 in accordance with the desired type of memory access. For example, during a read cycle, global control unit 110 signals sub control 115 to receive and output data detected by the sense amplifiers. Alternatively, during a write access, global control unit 110 signals sub control 115 to receive data and input data into selected bit locations in a memory group such as Group0 via the write drivers.

Furthermore, each memory bank such as Bank0 may comprise the plurality of memory cells (not shown) arranged in rows and columns. As known in the art, each memory cell may comprise two access switches whose gates are coupled to a word line (e.g., WL0-WL127). In a read or write operation, the memory cells arranged in one row are controlled by a same word line. More particularly, according to the decoded address of a read or write control signal, a word line is set to high using a corresponding word line driver 120 when the row of memory cells coupled to the word line will be accessed. The logic high state at the word line turns on each memory cell's access switches of the memory row to which the word line is coupled. As a result, a read or write operation can be performed through the turned on access switches.

Figure 3:
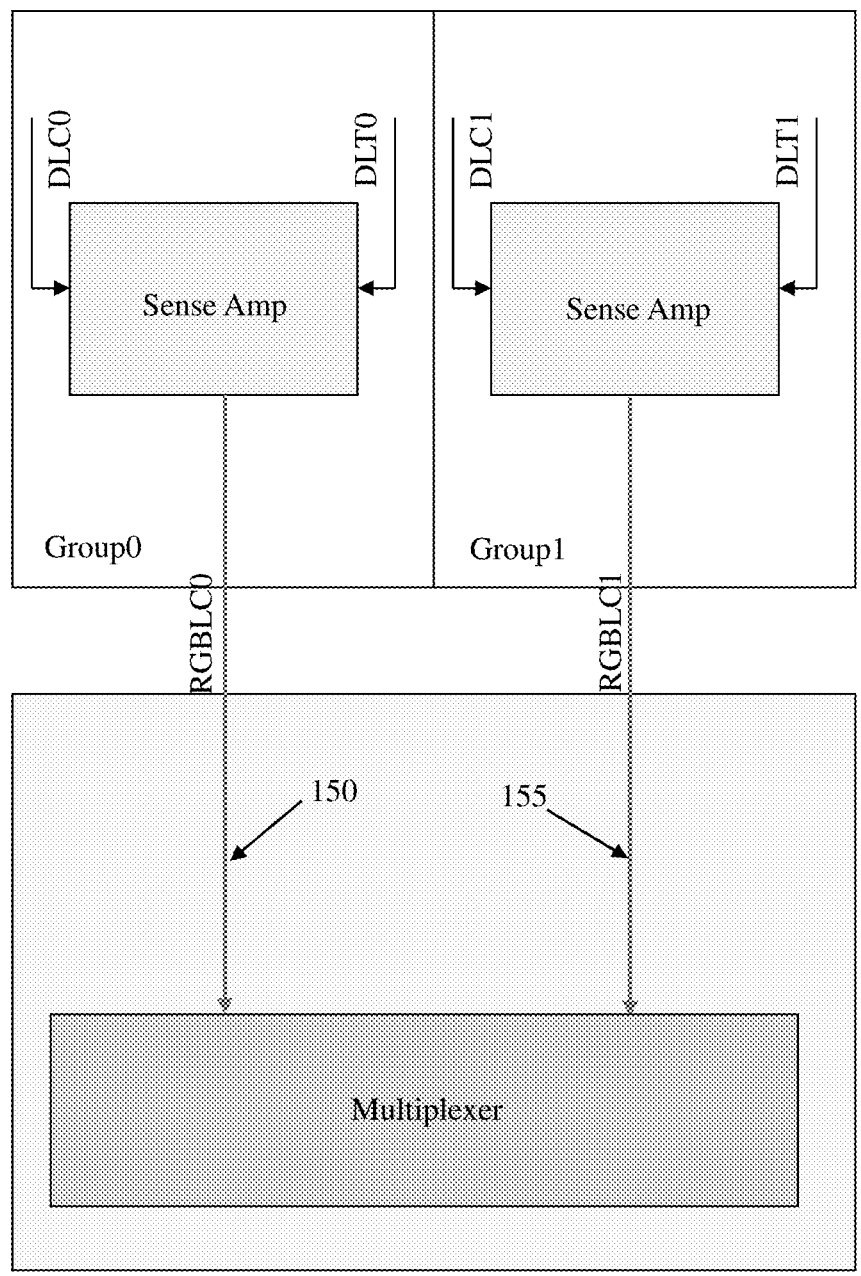

As shown in FIG. 3, during a typical read cycle, the read global bit lines 150 and 155 (e.g., RGBLC0 and RGBLC1) may be precharged low (e.g., Vss). As should be understood by those of ordinary skill in the art, if a memory cell desired to be read within each of the first memory group and the second memory group (e.g., Group0 and Group1) are in a logic 1 or high state, then the associated read global bit lines 150 and 155, respectively, are evaluated by an associated sense amp to be high and the read global bit lines 150 and 155 are switched or toggled on to a logic 1 or high state and burn power together. In a typical 6T SRAM device, a length of the metal layer (e.g., M4 wiring layer) used for wiring each of the read global bit lines may be about 400μ depending on the number of rows of memory cells in an array, which when switched or toggled on to a logic 1 or high state can create about 56 fF of capacitance or burned power for each read global bit line each time data is read from the read global bit line.

Figure 4:
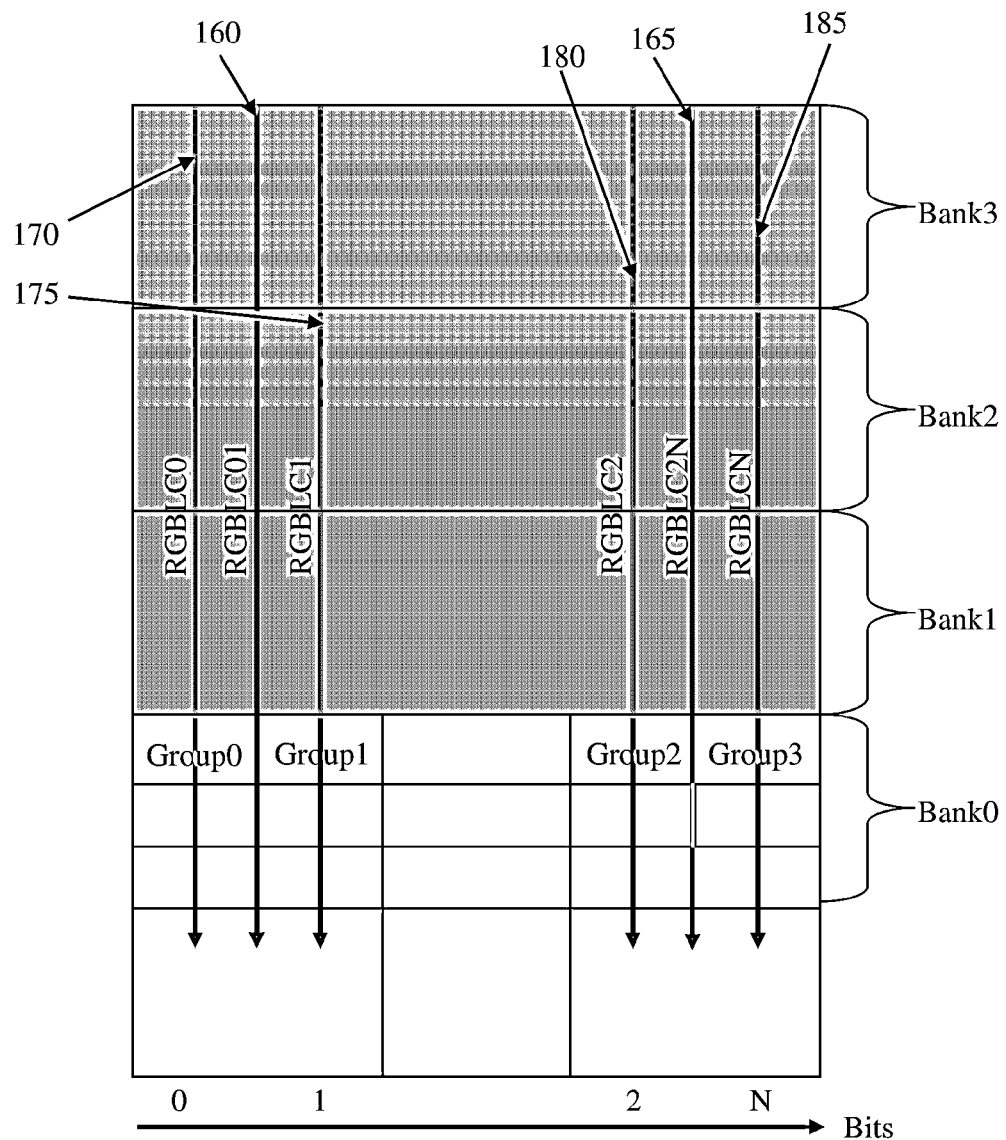

Embodiments of the present invention are configured to overcome the redundant toggling of a pair of read global bit lines (e.g., adjacent read global bit lines) to conserve burned power each time both read global bit lines are evaluated to be high. More specifically, as shown in FIG. 4, embodiments of the present invention incorporate an additional read global bit line 160, 165 for each pair of read global bit line 170, 175, and 180, 185 respectively. In embodiments, the pairing of the read global bit lines may be defined based on their proximity to one another. For example, each adjacent pair of read global bit lines may be associated with an additional read global bit line. In accordance with these aspects of the present invention, the term "adjacent" should be construed as meaning global bit lines of adjacent columns of memory cells.

In embodiments, additional logic circuitry may also be incorporated into the SRAM circuit, which is configured to determine whether each pair of the read global bit lines 170, 175, and/or 180, 185 are evaluated to be high. The additional logic circuitry is also configured that upon determining that each pair of the read global bit lines 170, 175, and/or 180, 185 are evaluated to be high, the additional logic circuitry toggles only the additional global bit line 160 and/or 165 to a logic 1 or a high state rather than both of the read global bit lines of each pair of read global bit lines 170, 175, and/or 180, 185.

Figure 5:
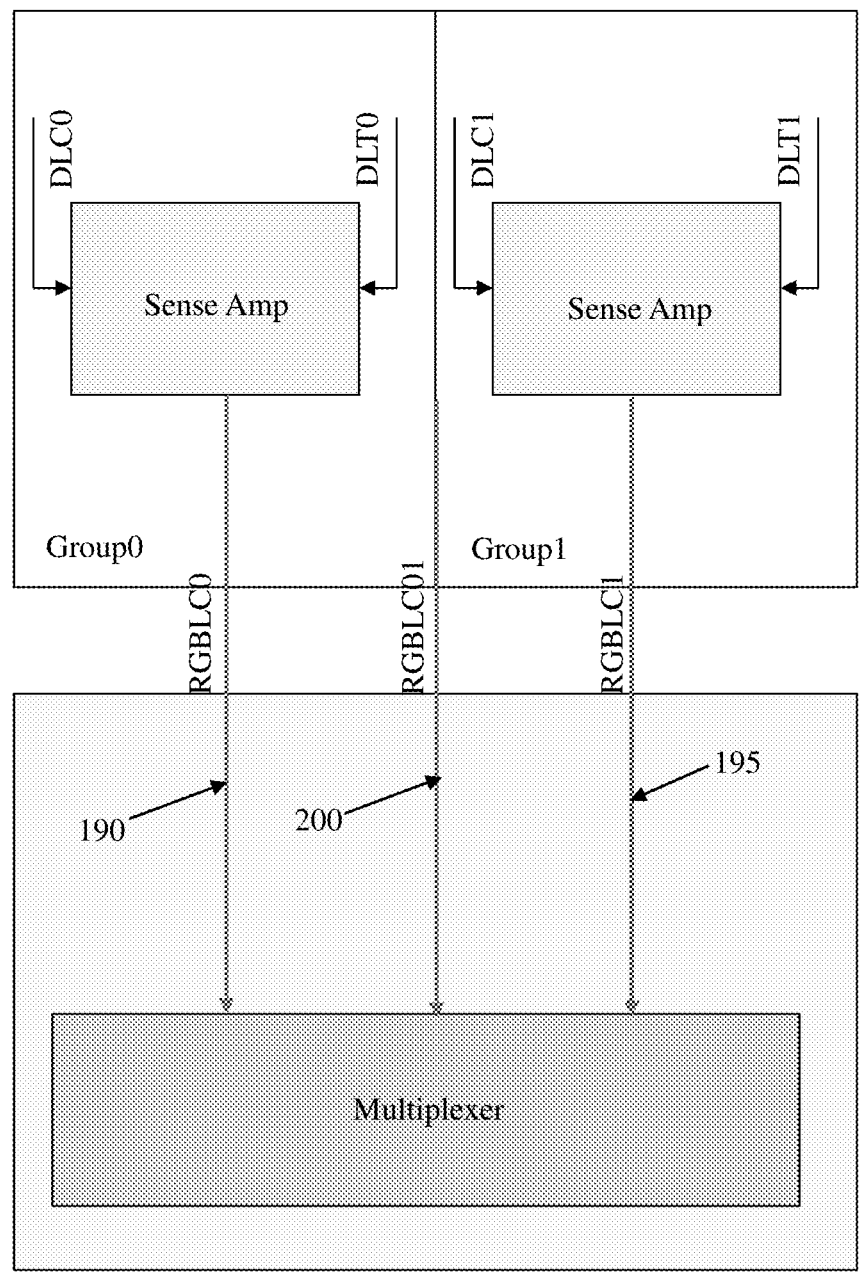

As shown in FIG. 5, in accordance with aspects of the present invention, during a typical read cycle, the read global bit lines 190 and 195 (e.g., RGBLC0 and RGBLC1) and the additional read global bit line 200 (e.g., RGBLC01) may be precharged low (e.g., Vss). If a memory cell desired to be read within each of the first memory group and the second memory group (e.g., Group0 and Group1) are in a logic 1 or high state, then the associated read global bit lines 190 and 195, respectively, are evaluated by an associated sense amp to be high and the additional read global bit line 200 is switched or toggled on to a logic 1 or high state and burns power alone. In accordance with these aspects of the present invention, in a typical 6T SRAM device, when the additional read global bit line is switched or toggled on to a logic 1 or high state, only about 56 fF of capacitance or burned power is utilized each time data is read from both of the read global bit lines.

Figure 6:
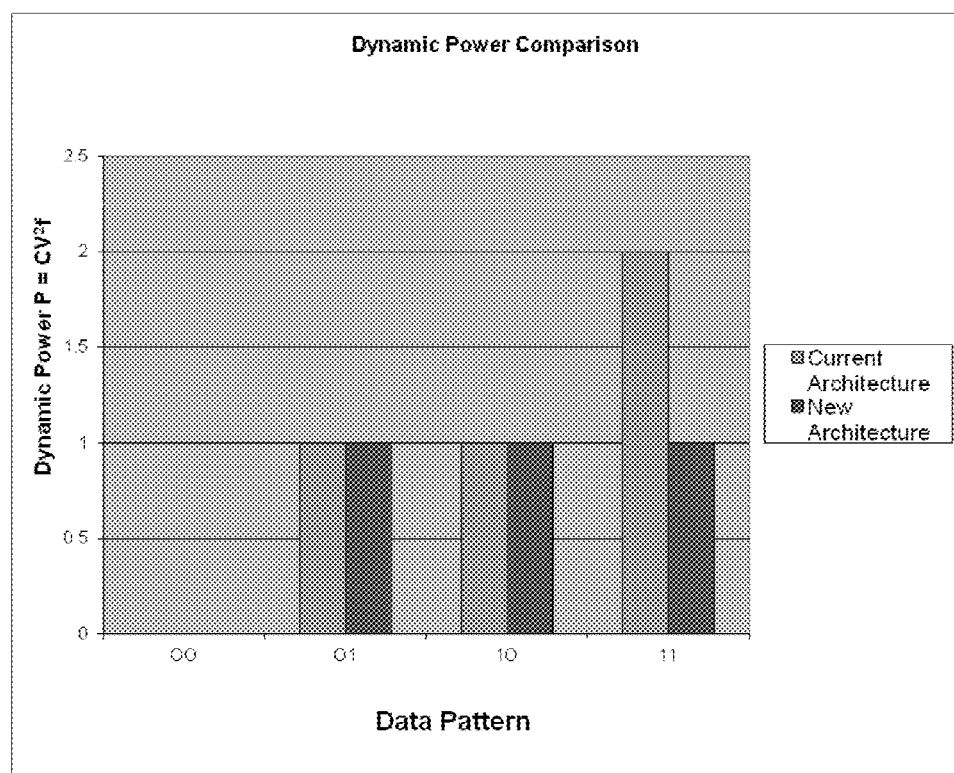
FIG. 6 shows dynamic power saving characteristics in accordance with aspects of the invention.

Accordingly, as shown in FIG. 6, embodiments of the present invention are configured to overcome the redundant toggling of a pair of read global bit lines each time both read global bit lines are evaluated to be high (e.g., data pattern logic 1, logic 1 or high, high), which results in a 50% savings in consumed power. Advantageously, it should be understood that the conservation in power from recognition of such a data pattern significantly reduces the total amount of power consumed by a typical SRAM circuit throughout a lifetime of the SRAM circuit.

Figure 7:
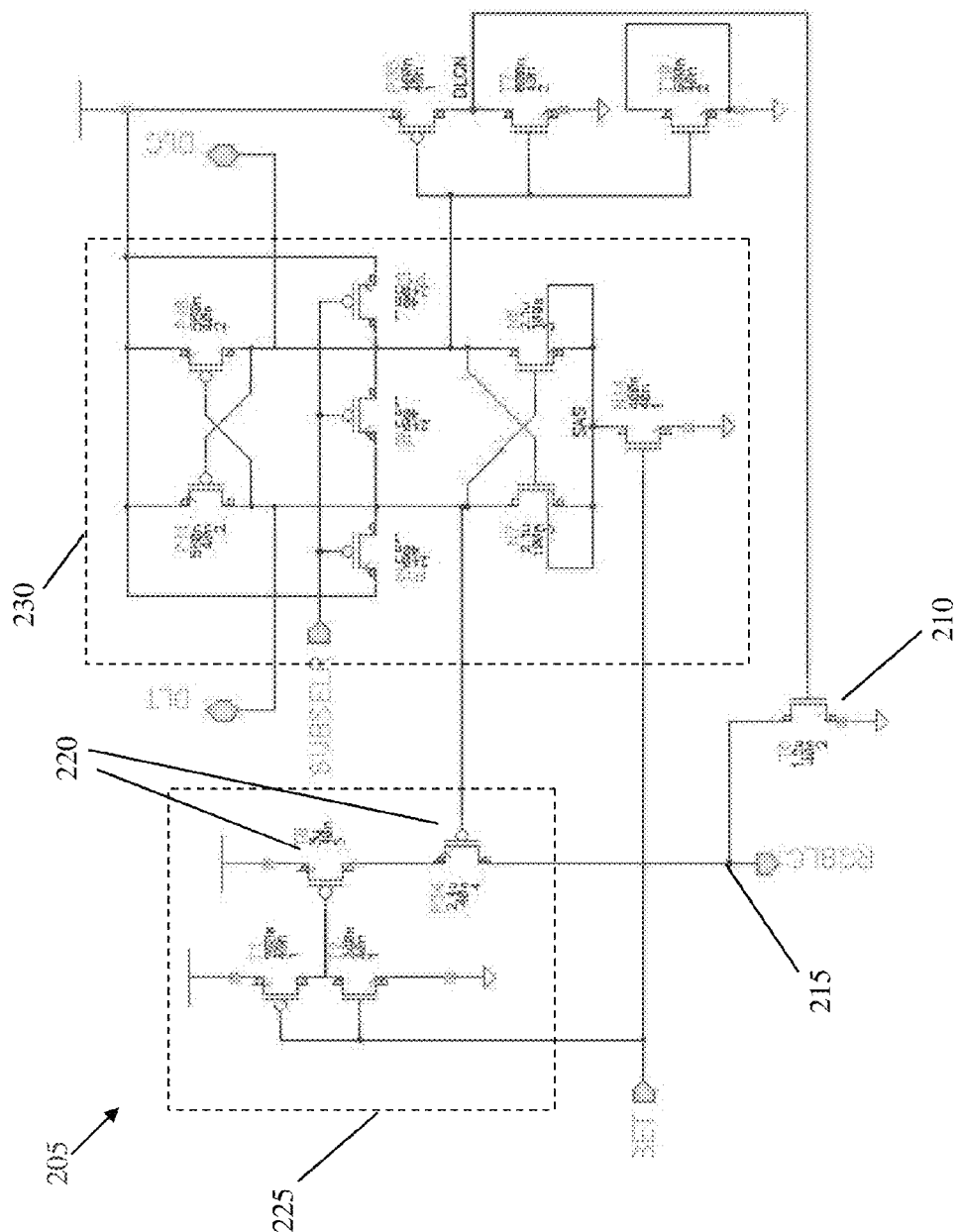
FIGS. 7 and 8 show schematic diagrams of transmitters for an SRAM circuit in accordance with aspects of the invention.

FIG. 7 shows the transmitter architecture of a typical 6T SRAM device 205. The 6T SRAM device 205 may include a precharge device 210 (e.g., a N-type metal-oxide-semiconductor logic (NMOS) device)) connected to a read global bit line 215. The precharge device 210 is configured to precharge the read global bit line 215 to a logic 0 or low state prior to a read operation. The read global bit line 215 is then evaluated (e.g., evaluated to be high) by the two devices 220 (e.g., a P-type metal-oxide-semiconductor logic (PMOS) devices) in the stack 225. For example, the sense amp drives the two devices 220, and if the data in memory cell 230 is a logic 0 or low state, then the two devices 220 are turned on and the read global bit line 215 is toggled to a logic 1 or high state. If the data in memory cell 230 is a logic 1 or high state, then sense amp drives DLCN to high and further drives read global bit line 215 to low through NMOS 210.

Figure 8:
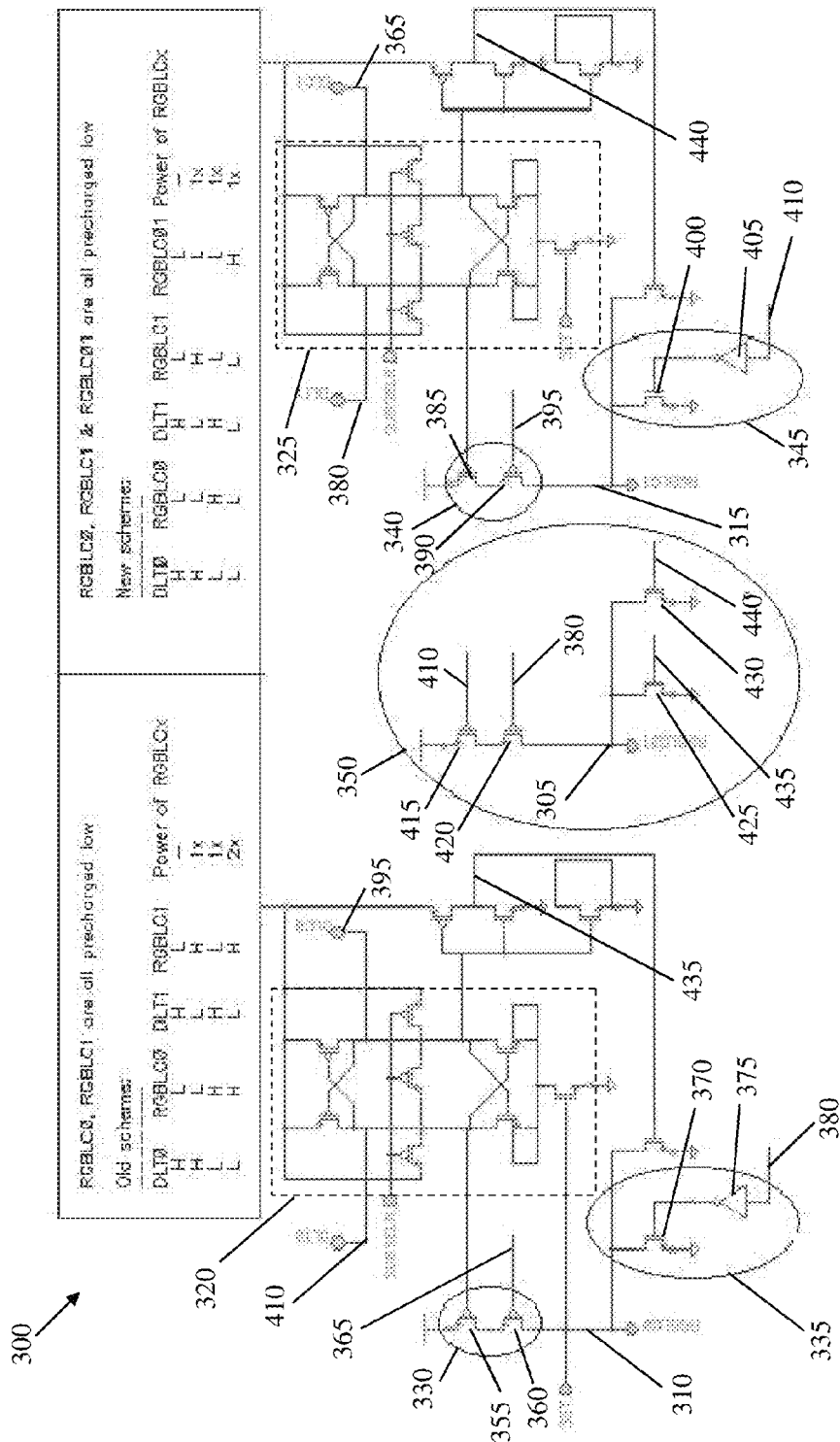

FIG. 8 shows the transmitter architecture of a 6T SRAM device 300 in accordance with aspects of the present invention. The 6T SRAM device 300 includes an additional read global bit line 305 associated with a pair of read global bit lines 310 and 315 connected receptively to sense amplifiers 320 and 325 (e.g., sense amplifiers connected to one or more memory cells). In embodiments, the 6T SRAM device 300 also includes additional logic circuitry 330 and 335 connected to the read global bit line 310, additional logic circuitry 340 and 345 connected to read global bit line 315, and logic circuitry 350 connected to additional read global bit line 305.

In embodiments, the additional logic circuitry 330 may comprise two PMOS devices 355 and 360 with the PMOS device 355 connected to the sense amplifier 320 and the PMOS device 360 connected to the read global bit line 310 and a complement data line 365 (DLC1). The additional logic circuitry 335 may comprise an NMOS device 370 connected to the read global bit line 310 and an inverter 375. The inverter 375 may be connected to a data line 380 (DLT1). The additional logic circuitry 340 may comprise two PMOS devices 385 and 390 with the PMOS device 385 connected to the sense amplifier 325 and the PMOS device 390 connected to the read global bit line 315 and a complement data line 395 (DLC0). The additional logic circuitry 345 may comprise an NMOS device 400 connected to the read global bit line 315 and an inverter 405. The inverter 405 may be connected to a data line 410 (DLT0). The additional logic circuit 350 may comprise two PMOS devices 415 and 420 and two NMOS devices 425 and 430. The PMOS device 415 may be connected to the data line 410 (DLT0) and the PMOS device 420 may be connected to the data line 380 (DLT1) and the additional read global bit line 305. The NMOS device 425 may be connected to the additional read global bit line 305 and a data line 435 (DLCN0). The NMOS device 430 may be connected to a data line 440 (DLCN1).

In accordance with aspects of the present invention, when DLT0 is high, the read global bit line 310 is evaluated as low, and when the DLT0 is low, the read global bit line 310 is evaluated as high. Additionally, when DLT1 is high, the read global bit line 315 is evaluated as low, and when the DLT1 is low, the read global bit line 315 is evaluated as high. The additional logic circuits 330, 335, 340, 345, and 350 are configured to determine when both the read global bit lines 310 and 315 are evaluated as high, and toggle the additional read global bit line 305 to a high state rather than toggling both of the read global bit lines 310 and 315 to high state.

Figure 9:
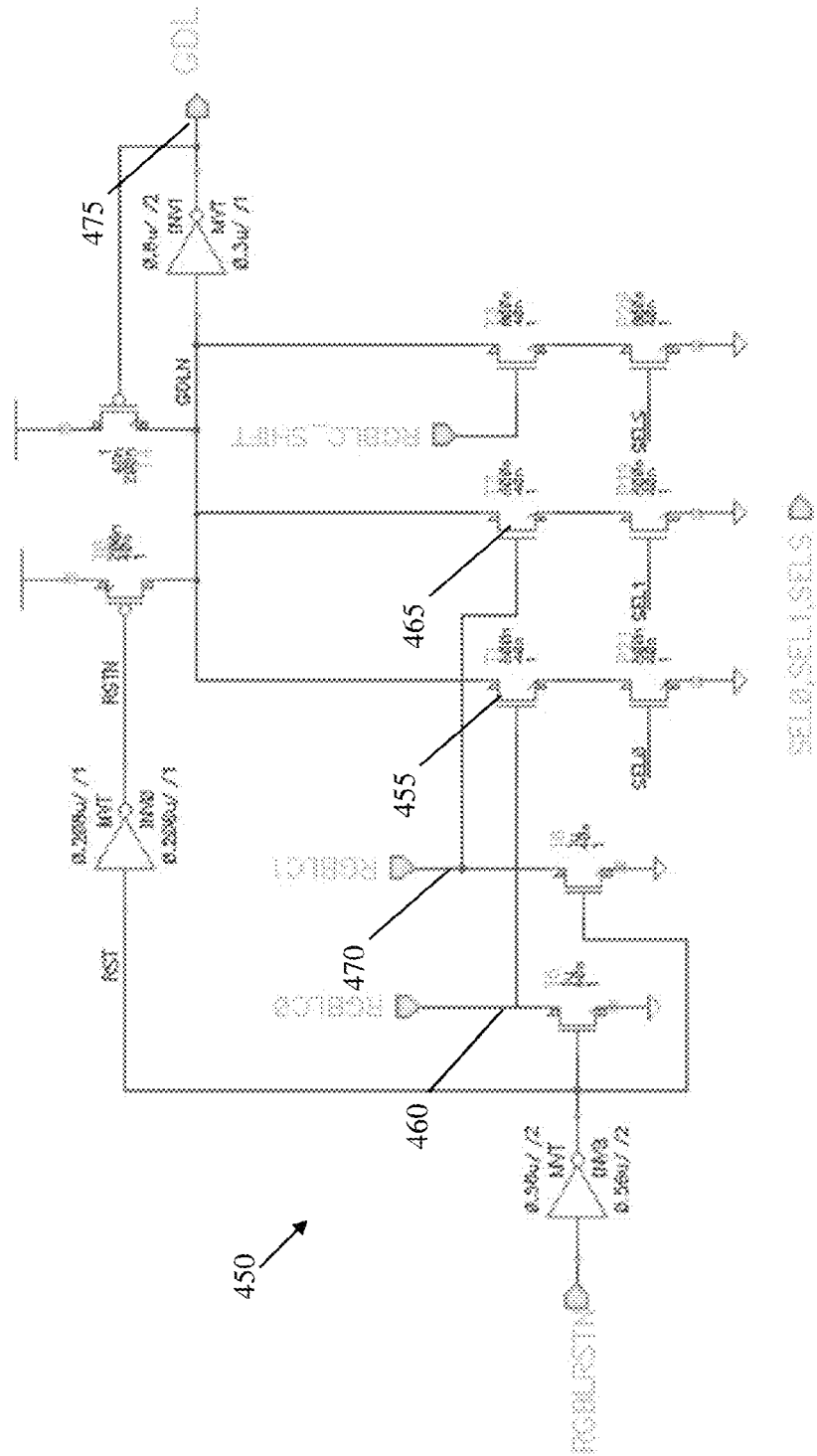
FIGS. 9 and 10 show schematic diagrams of receivers for an SRAM circuit in accordance with aspects of the invention.

FIG. 9 shows the receiver architecture of a typical 6T SRAM device 450. The SRAM device 450 may include a NMOS device 455 connected to a first read global bit line 460 from a first memory cell (e.g., memory cell 230 shown in FIG. 7), and a NMOS device 465 connected to a second read global bit line 470 from a second memory cell (not shown). If the first read global bit line 460 is turned on to a high state, then the NMOS device 455 is turned on and the global data line 475 (GDL) is turned on to a high state. On the other hand, if the second read global bit line 470 is turned on to a high state, then the NMOS device 465 is turned on and the GDL 475 is turned on to a high state.

Figure 10:
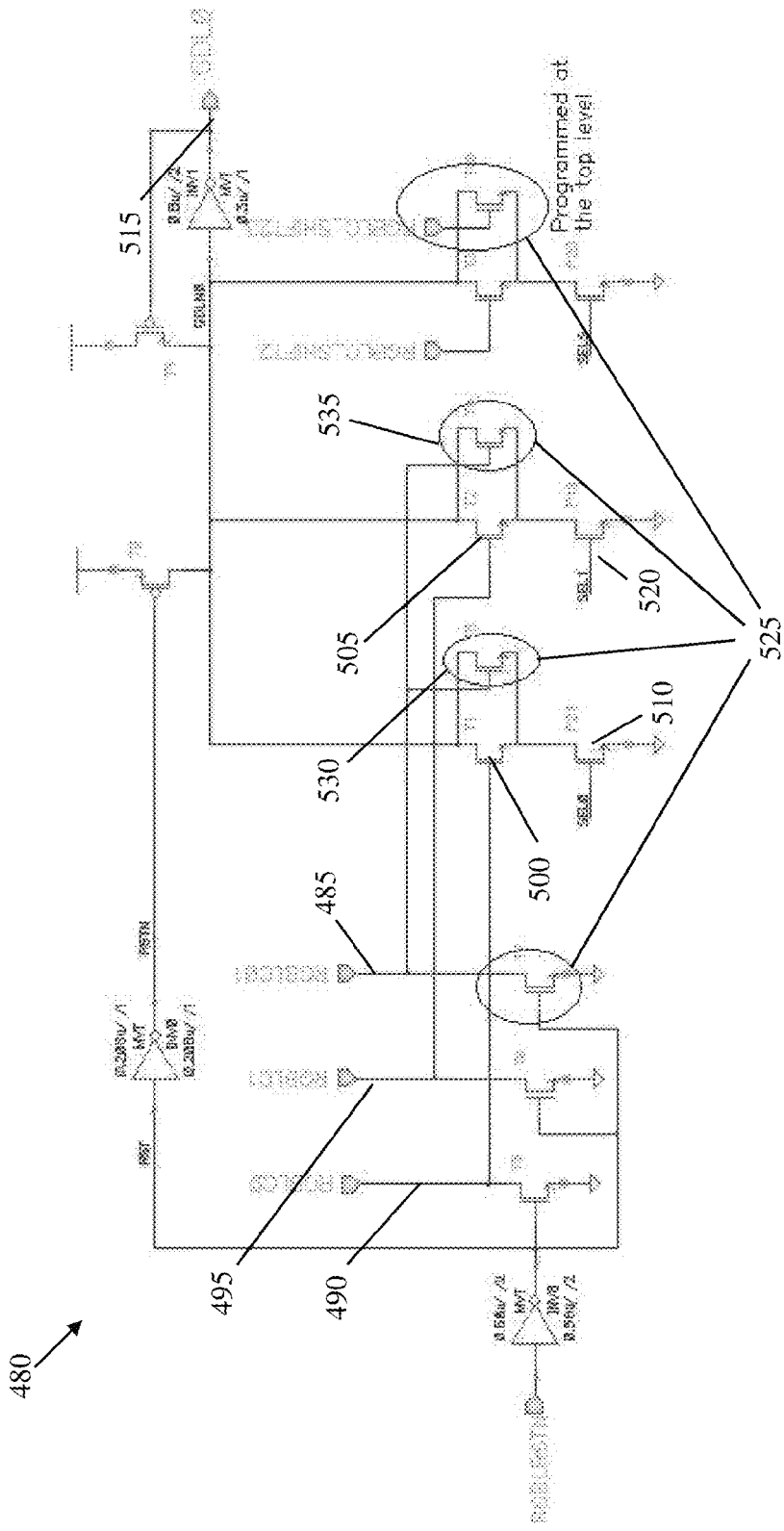

FIG. 10 shows the receiver architecture of a 6T SRAM device 480 in accordance with aspects of the present invention. The 6T SRAM device 480 includes an additional read global bit line 485 associated with a pair of read global bit lines 490 and 495 connected receptively to sense amplifiers (for example sense amplifiers 320 and 325 as discussed with respect to FIG. 8). The SRAM device 480 may further include a NMOS device 500 connected to the first read global bit line 490 from the first sense amplifier (e.g., sense amplifier 320 shown in FIG. 8), and a NMOS device 505 connected to a second read global bit line 495 from a second sense amplifier (e.g., sense amplifier 325 shown in FIG. 8). SEL0 and SEL1 are higher column select signals that decode between the pair of read global bit lines 490 and 495. If the first read global bit line 490 and SEL0 are turned on to a high state, then the NMOS devices 500 and 510 are turned on to a high state and the global data line 515 (GDL) is turned on to a high state. On the other hand, if the second read global bit line 495 and SEL1 are turned on to a high state, then the NMOS devices 505 and 520 are turned on to a high state and the GDL 515 is turned on to a high state.

In embodiments, the 6T SRAM device 480 also includes additional logic circuitry 525 connected to the additional read global bit line 485. The additional logic circuitry 525 comprises NMOS devices 530 and 535, which are configured to turn on together to a high state and the global data line GDL 515 is turned on to a high state. If a logic pattern is present where both adjacent bit lines are evaluated to a high state based on storage values inside the memory cells (Group0, Group1, etc. as shown in FIG. 2), instead of turning both of the read global bit lines 490 and 495 on to a high state, only the additional read global bit line 485 is turned on to a high state. In such an instance, the NMOS devices 530 and 535 will be turned on to a high state and evaluate GDL 515 to a high state based on SEL0 or SEL1.

Figure 11:
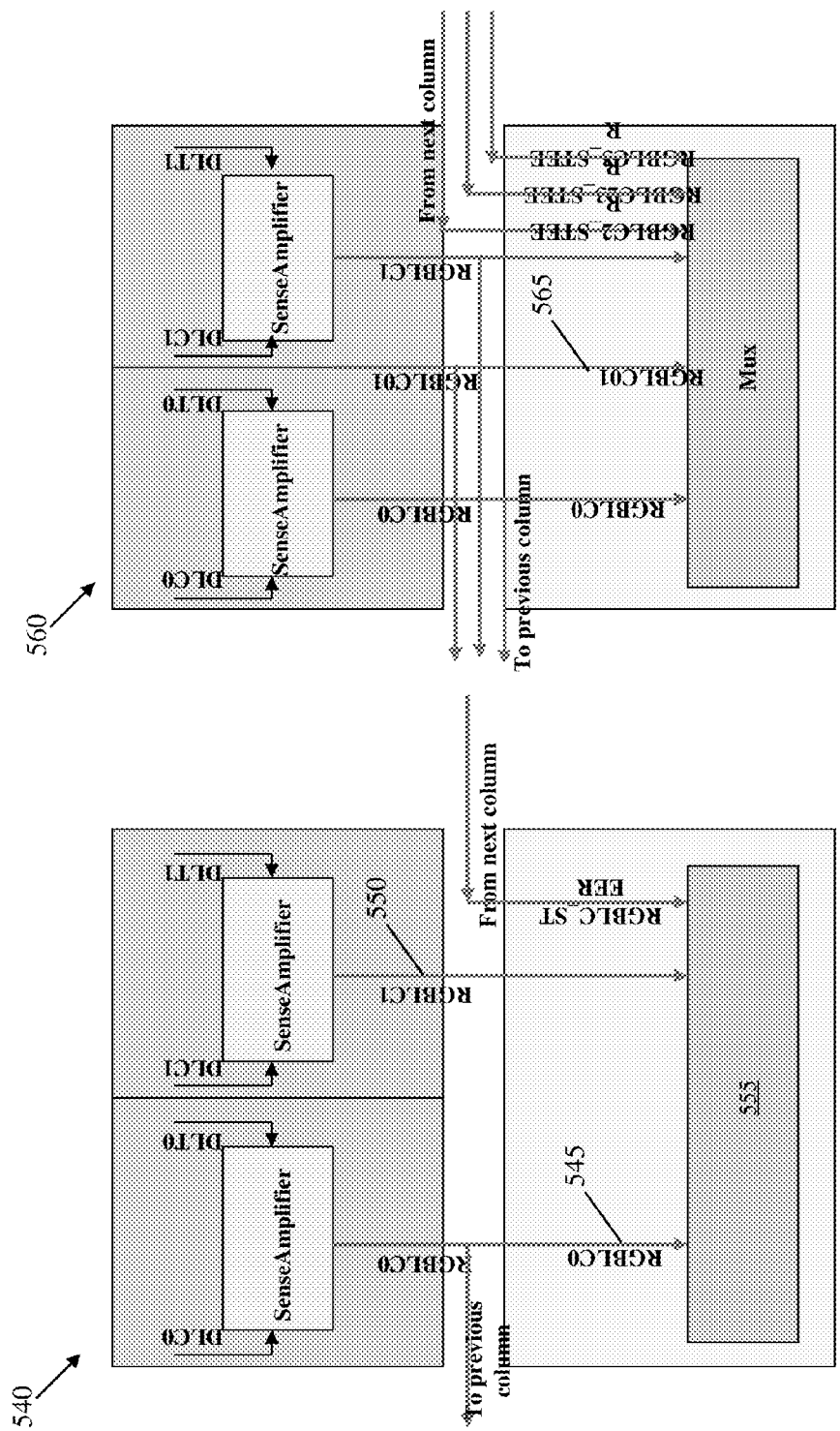
FIG. 11 shows column redundancy and decode multiplexing designs in accordance with aspects of the invention.

FIG. 11 shows that in the conventional architecture 540 column redundancies and higher column decoding are implemented by replacing one sense amp structure and steering is performed accordingly. For example, read global bit lines 545 and 550 may be associated with an adjacent pair of columns coming from, for example, Group0 and Group1 of FIG. 2. A multiplexer 555 comprises logic for higher decoding and redundancy steering. Either read global bit line 545 or read global bit line 550 may be selected based on a higher decoding address to send a signal from multiplexer 555 to output latches (not shown). However, if one of the columns from the adjacent pair of columns coming from, for example, Group0 or Group1 is failing to properly write or read data to memory cells within the column, then the failing column can be replaced by an extra column reserved for replacement by steering the data coming into the failed column to a next adjacent good column.

In embodiments of the present invention, the SRAM circuit architecture 560 column redundancies and higher column decoding are implemented by replacing two sense amp structures and steering is performed accordingly. For example, if one of the columns from the adjacent pair of columns coming from, for example, Group0 or Group1 is failing to properly write or read data to memory cells within the column, then the failing column can be replaced by an extra column reserved for replacement by steering the data coming into the failed column to a next adjacent good column. However, in accordance with aspects of the present invention, the other column of the adjacent pair of columns is also replaced by a second extra column reserved for replacement by steering the data coming into the other column to a next adjacent good column such that an additional read global bit line 565 is still configured to turned on to a high state when a logic pattern is present where both adjacent bit lines are evaluated to a high state instead of turning on both of the adjacent read global bit lines to a high state.

A typical 6T SRAM device with 144 read global bit lines, a supply voltage of about 0.9 v, a frequency of about 1 Ghz, and a capacitance of about 56 fF per read global bit line can be expected to consume about 21.9 mWatts of read power for all ones data and 12.6 mWatts of read power for all zeros data, which averages to about 17.25 mWatts of read power consumed during a typical read cycle. However, a 6T SRAM device with similar parameters designed and implemented in accordance with aspects of the present invention is capable of achieving about a 0.8 mWatts of average power savings (one read global bit line switching power is about 45 uWatts) such that advantageously the average read power consumed during a typical read cycle goes down from about 17.25 mWatts to about 16.45 mWatts. Accordingly, the SRAM device and memory read methodology of the present invention are capable of achieving about a 4.6% reduction in overall read power consumed.

In embodiments, the additional read global bit line and associated additional logic circuitry may cause a small penalty of timing as the DLC/DLT nodes are slightly loaded. For example, with a double load on DLC and DLT, there could be about a 10 ps performance loss at a performance corner. However, in accordance with aspects of the present invention, any potential delay caused by the double load on DLC and DLT nodes may be compensated for by increasing a device size of the sense amps.

It should be understood that although aspects of the present invention are discussed herein with respect to exemplary 6T (6 transistor) SRAM devices, the SRAM devices and memory read methodologies of the present invention may be utilized with respect to any type of memory device (e.g., 8T SRAM, 4T SRAM) that is evaluating at least two adjacent read global bit lines without departing from the spirit and scope of the present invention.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory circuit, comprising:
   a first read global bit line connected to a first sense amp;
   a second read global bit line connected to a second sense amp, wherein the second read global bit line is adjacent to the first read global bit line;
   a third read global bit line; and
   logic circuitry connected to the first read global bit line, the second read global bit line, and the third read global bit line, wherein the logic circuitry is configured to determine when both the first read global bit line and the second read global bit line are evaluated as in a high state, and in response to determining both the first read global bit line and the second read global bit line are evaluated as in the high state, toggle the third read global bit line to the high state.

2. The memory circuit of claim 1, wherein the third read global bit line is toggled to the high state rather than toggling both of the first read global bit line and the second read global bit line to the high state.

3. The memory circuit of claim 1, further comprising a precharge device configured to precharge the first read global bit line, the second read global bit line, and the third read global bit line to a low state prior to a read operation.

4. The memory circuit of claim 1, wherein the logic circuitry comprises a first group of transmitter logic circuitry connected to the first read global bit line, a second group of transmitter logic circuitry connected to the second read global bit line, and a third group of transmitter logic circuitry connected to the third read global bit line.

5. The memory circuit of claim 4, wherein the first group of transmitter logic circuitry comprises:
   a first P-type metal-oxide-semiconductor logic (PMOS) device connected to the first sense amp;
   a second PMOS device connected to the first read global bit line and a first complement data line; and
   a first N-type metal-oxide-semiconductor logic (NMOS) device connected to the first read global bit line and a first inverter, wherein the first inverter is connected to a first data line.

6. The memory circuit of claim 5, wherein the second group of transmitter logic circuitry comprises:
   a third PMOS device connected to the second sense amp;
   a fourth PMOS device connected to the second read global bit line and a second complement data line; and
   a second NMOS device connected to the second read global bit line and a second inverter, wherein the second inverter is connected to a second data line.

7. The memory circuit of claim 6, wherein the third group of transmitter logic circuitry comprises:
   a fifth PMOS device connected to the second data line;
   a sixth PMOS device connected to the first data line and the third read global bit line;
   a third NMOS device connected to the third read global bit line and a third data line; and
   a fourth NMOS device connected to the third read global bit line and a fourth data line.

8. The memory circuit of claim 7, wherein the logic circuitry is further configured such that when the first data line is in the high state, the first read global bit line is evaluated as in a low state, and when the first data line is in the low state, the first read global bit line is evaluated as in the high state.

9. The memory circuit of claim 8, wherein the logic circuitry is further configured such that when the second data line is in the high state, the second read global bit line is evaluated as in the low state, and when the second data line is in the low state, the second read global bit line is evaluated as in the high state.

10. The memory circuit of claim 9, wherein the logic circuitry further comprises a group of receiver logic circuitry connected to the third read global bit line, the group of receiver logic circuitry comprising a fifth NMOS device and a sixth NMOS device that are configured to turn on together to the high state and turn on a global data line to the high state.

11. A memory circuit, comprising:
   a pair of read global bit lines connected to a pair of sense amps respectively and a multiplexer, wherein the pair of read global bit lines are configured to read a logic state of two memory cells respectively located within two adjacent columns of memory cells;
   an additional read global bit line; and
   logic circuitry connected to the pair of read global bit lines and the additional read global bit line, wherein the logic circuitry is configured to determine when both read global bit lines of the pair of read global bit lines are evaluated as in a high state, and in response to determining both of the read global bit lines are evaluated as in the high state, toggle only the additional read global bit line to the high state.

12. The memory circuit of claim 11, wherein the logic circuitry comprises transmitter logic circuitry connected to the additional read global bit line, the transmitter logic circuitry comprising:
   a first P-type metal-oxide-semiconductor logic (PMOS) device connected to a first data line;
   a second PMOS device connected to a second data line and the additional read global bit line;
   a first N-type metal-oxide-semiconductor logic (NMOS) connected to the additional read global bit line and a third data line; and
   a second NMOS device connected to the additional read global bit line and a fourth data line.

13. The memory circuit of claim 12, wherein the logic circuitry is further configured such that when the first data line is in the high state, one of the pair of read global bit lines is evaluated as in a low state, and when the first data line is in the low state, the one of the pair of read global bit lines is evaluated as in the high state.

14. The memory circuit of claim 13, wherein the logic circuitry is further configured such that when the second data line is in the high state, another of the pair of read global bit lines is evaluated as in the low state, and when the second data line is in the low state, the another of the pair of read global bit line is evaluated as in the high state.

15. The memory circuit of claim 14, wherein the logic circuitry further comprises receiver logic circuitry connected to the additional read global bit line, the receiver logic circuitry comprising a third NMOS device and a fourth NMOS device that are configured to turn on together to the high state and turn on a global data line to the high state.

16. The memory circuit of claim 15, further comprising a precharge device configured to precharge the pair of read global bit lines and the additional read global bit line to the low state prior to a read operation.

17. The memory circuit of claim 11, wherein the memory circuit is a static random access memory (SRAM) device and each column of the two adjacent columns of memory cells represent a memory group respectively of the SRAM device.

18. The memory circuit of claim 17, wherein each of the memory cells of the SRAM device comprises at least six field effect transistors.

19. The memory circuit of claim 11, wherein the multiplexer comprises logic circuitry for higher decoding and redundancy steering.

20. A method comprising:
   precharging a first read global bit line, a second read global bit line, and a third read global bit line to a low state prior to a read operation of a static random access memory (SRAM) device;
   when a first data line is in a low state, evaluate the first read global bit line as in a high state;
   when a second data line is in the low state, evaluate the second read global bit line as in the high state; and
   when both the first read global bit line and the second read global bit line are evaluated as in the high state, toggle the third read global bit line to the high state rather than toggling both of the first read global bit line and the second read global bit line to the high state.

* * * * *